United States Patent
Lyons et al.

(10) Patent No.: US 9,786,977 B2
(45) Date of Patent: Oct. 10, 2017

(54) POCKETED CIRCUIT BOARD

(71) Applicant: Teradyne, Inc., North Reading, MA (US)

(72) Inventors: Timothy Daniel Lyons, Stoughton, MA (US); Frank B. Parrish, Simi Valley, CA (US); Roger Allen Sinsheimer, Camarillo, CA (US); Brian G. Donovan, Winchester, MA (US); Vladimir Vayner, Needham, MA (US); Brandon E. Creager, Newport Beach, CA (US); Brian C. Wadell, Reading, MA (US)

(73) Assignee: Teradyne, Inc., North Reading, MA (US)

( * ) Notice: Subject to any disclaimer, the term of this patent is extended or adjusted under 35 U.S.C. 154(b) by 130 days.

(21) Appl. No.: 14/965,510

(22) Filed: Dec. 10, 2015

(65) Prior Publication Data

US 2017/0170537 A1    Jun. 15, 2017

(51) Int. Cl.
  *H01P 3/08* (2006.01)
  *H05K 1/02* (2006.01)
  *H05K 1/11* (2006.01)

(52) U.S. Cl.
  CPC ............ *H01P 3/082* (2013.01); *H05K 1/024* (2013.01); *H05K 1/0243* (2013.01); *H05K 1/115* (2013.01); *H05K 2201/09036* (2013.01)

(58) Field of Classification Search
  CPC ........ H01P 3/082; H05K 1/0243; H05K 1/115
  USPC .......................................... 333/238; 361/748
  See application file for complete search history.

(56) References Cited

U.S. PATENT DOCUMENTS

| 5,574,630 A | * | 11/1996 | Kresge ............. H01L 23/49861 174/255 |
| 6,512,389 B1 | | 1/2003 | Kocher |
| 6,873,219 B2 | * | 3/2005 | Grebenkemper .... H05K 1/0234 333/12 |
| 2004/0140821 A1 | | 7/2004 | Lee |
| 2008/0048796 A1 | | 2/2008 | Shaul et al. |
| 2009/0071705 A1 | | 3/2009 | Kim et al. |

FOREIGN PATENT DOCUMENTS

| EP | 1923950 A1 | 5/2008 |
| KR | 200312425 Y1 | 5/2003 |

OTHER PUBLICATIONS

International Search Report for PCT/US2016/052055, 3 pages (dated Dec. 8, 2016).
Written Opinion for PCT/US2016/052055, 5 pages (dated Dec. 8, 2016).

* cited by examiner

*Primary Examiner* — Dean Takaoka
(74) *Attorney, Agent, or Firm* — Choate, Hall & Stewart LLP; Paul Pysher

(57) ABSTRACT

An example circuit board structure includes: a substrate; and vias that are electrically conductive and that pass through the substrate to enable electrical connection through the circuit board structure. The substrate is thinner, and lengths of the vias are shorter, in first areas of the circuit board structure that deliver first speed signals than in second areas of the circuit board structure that deliver second speed signals and power. The first speed signals have a shorter rise time than the second speed signals.

26 Claims, 13 Drawing Sheets

POCKETED CIRCUIT BOARD

TECHNICAL FIELD

This specification relates generally to a circuit board having pockets in which signal connections are made.

BACKGROUND

Conductive vias pass signals through a printed circuit board (PCB). Signals can degrade as they pass through the vias. Signal speed and via length can affect the amount of signal degradation. Typically, signal degradation increases as signal speeds and via lengths increase.

SUMMARY

An example circuit board structure comprises: a substrate, and vias that are electrically conductive and that pass through the substrate to enable electrical connection through the circuit board structure. The substrate is thinner in first areas of the circuit board structure that deliver first type signals than in second areas of the circuit board structure that deliver second type signals. The example circuit board structure may include one or more of the following features, either alone or in combination.

Lengths of the vias may be shorter in the first areas of the substrate. The first type signals may comprise first speed signals, the second type signals may comprise second speed signals and power, and the first speed signals may have a shorter rise time than the second speed signals.

The substrate may comprise one or more pockets that are at thinner parts of the substrate in the first areas. The substrate may comprise multiple layers, and the one or more pockets may be formed by removal of at least some of the multiple layers. The circuit board structure may comprise a backing plate disposed adjacent to thinner parts of the substrate in the first areas to reinforce the substrate.

The circuit board structure may comprise an interposer adjacent to the substrate and comprising electrical paths that connect to the vias to establish a signal path. The interposer may comprise contacts for mating to an external device. The interposer may comprise a structure that provides a micro-compliant electrical path from the circuit board structure to an assembly that carries the first speed signals to/from a source/receiver.

The circuit board structure may comprise one or more alignment pins through the substrate for aligning to one or more connectors to the circuit board structure.

The first speed signals may have speeds that meet or exceed 16 gigabits-per-second, and the second speed signals may have speeds that are less than 16 gigabits-per-second; or the first speed signals may have speeds that meet or exceed 16 gigahertz, and the second speed signals may have speeds that are less than 16 gigahertz. The first speed signals may have speeds that meet or exceed 32 gigabits-per-second, and the second speed signals may have speeds that are less than 32 gigabits-per-second; or the first speed signals may have speeds that meet or exceed 32 gigahertz, and the second speed signals may have speeds that are less than 32 gigahertz. The first speed signals may have speeds that meet or exceed 64 gigabits-per-second, and the second speed signals may have speeds that are less than 64 gigabits-per-second; or the first speed signals may have speeds that meet or exceed 64 gigahertz, and the second speed signals may have speeds that are less than 64 gigahertz.

Thinner parts of the substrate in the first areas may have a thickness that is 20% or less of thicker parts of the substrate in the second areas. Thinner parts of the substrate in the first areas may have a thickness that is 30% or less of thicker parts of the substrate in the second areas. Thinner parts of the substrate in the first areas may have a thickness that is 40% or less of thicker parts of the substrate in the second areas.

The circuit board structure may comprise a tower that mates to a complementary pocket in another circuit board.

An example device interface board (DIB) for connection between a device under test and test equipment comprises a circuit board structure that comprises the following features: a substrate; and vias that are electrically conductive and that pass through the substrate to enable electrical connection through the circuit board structure. The substrate is thinner in first areas of the circuit board structure that deliver first type signals than in second areas of the circuit board structure that deliver second type signals.

In the circuit board structure, the first type signals may comprise radio frequency (RF) signals and the second type signals may comprise non-RF signals. The first areas of the substrate may comprise an area that includes a first dielectric having metal on which a microwave component is mountable, with the first dielectric being adjacent to a microwave dielectric layer.

In the circuit board structure, the second areas of the substrate may comprise an area that includes a stack of dielectric layers that that do not include a microwave dielectric. The vias may have a diameter that is based on a thickness of the first areas of the substrate. The vias in the first areas of the substrate may have diameters that are less than diameters of vias in the second areas of the substrate.

An example device interface board (DIB) comprises: a substrate having a first area of a first thickness and a second area of a second thickness, with the second thickness being greater than the first thickness; and vias that are electrically conductive and that pass through the first area to enable electrical connection between the vias and a device under test, where vias that pass through the first area are reserved for transmission of signals having at least a minimum speed. The example DIB may include one or more of the following features, either alone or in combination.

The DIB may comprise vias through the second area that are reserved for transmission of signals that do not meet the minimum speed. The DIB may include a backing plate disposed adjacent to the first areas to reinforce the substrate. The DIB may include one or more alignment pins through the substrate for aligning to one or more connectors that are connectable to the DIB.

The minimum speed may be 16 gigabits-per-second, 32 gigabits-per-second, or 64 gigabits-per-second; or the minimum speed may be 16 gigahertz, 32 gigahertz, or 64 gigahertz. The first areas of the substrate may have a thickness that is 20% or less of the second areas of the substrate.

Any two or more of the features described in this specification, including in this summary section, can be combined to form implementations not specifically described herein.

The test systems and testing described herein, or portions thereof, can be implemented as/controlled by a computer program product that includes instructions that are stored on one or more non-transitory machine-readable storage media, and that are executable on one or more processing devices to control (e.g., coordinate) the operations described herein.

The circuit board structure described herein can be part of any appropriate apparatus or electronic system, and is not limited to testing.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Described herein are examples of circuit boards that have pockets, or cavities, to implement electrical connections to vias internal to the circuit boards. By incorporating pockets into a circuit board, total lengths of the vias within the circuit can be decreased by making connections in parts of the circuit board where the pockets are located. As a result, signal degradation caused by passage of signals through the vias can be decreased, resulting in improved signal integrity. This effect can be more pronounced for higher-speed signals (an example of a first type signal), which can degrade more than lower-speed signals (an example of a second type signal) along the length of a via. Examples of the circuit boards described herein are employed in the context of automatic test equipment, however, the circuit boards are not limited to use in testing, and may be used in any appropriate context.

Figure 1:
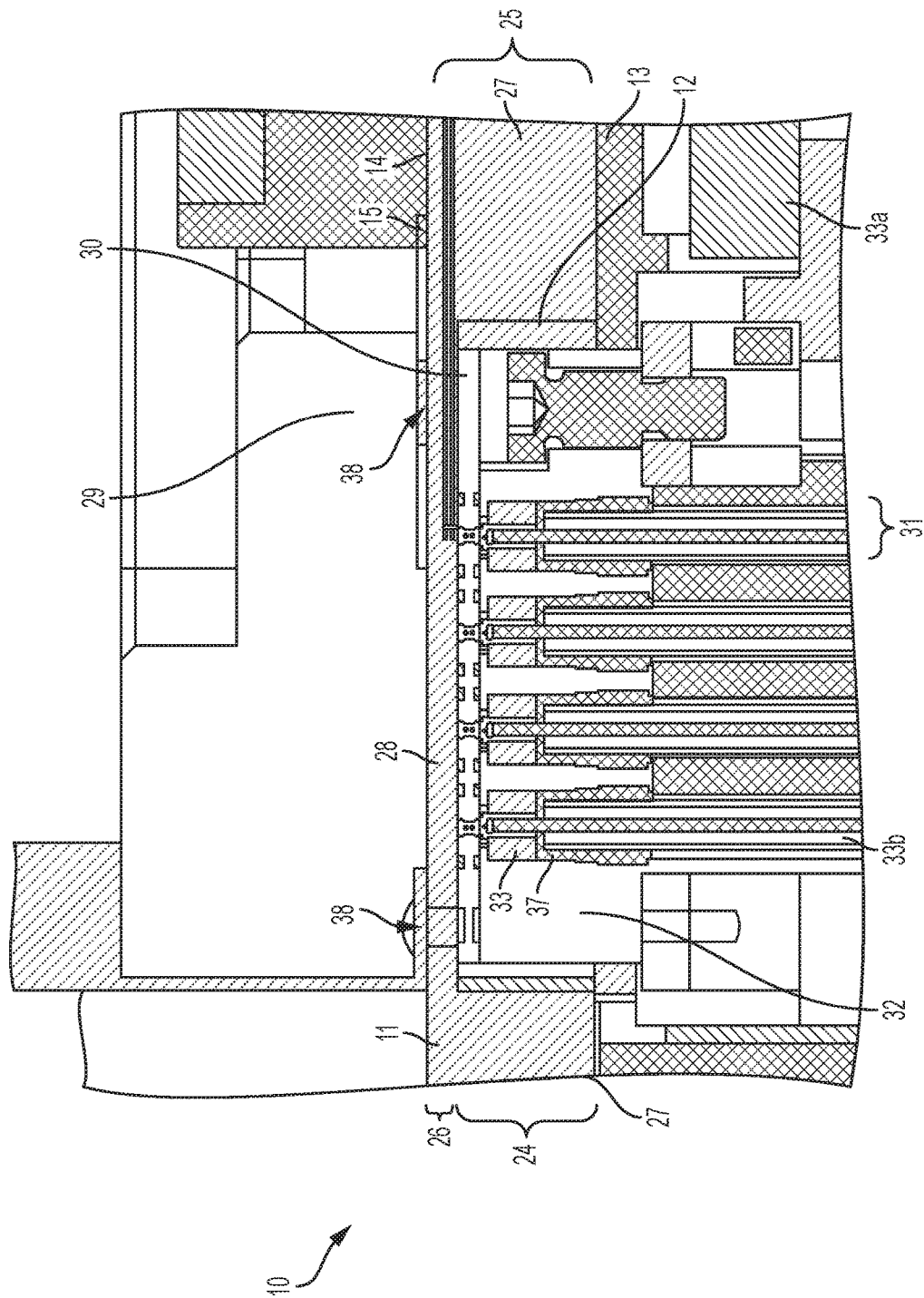
FIG. 1 is a cut-away view of a part of an example circuit board structure.

FIG. 1 shows an example of a circuit board structure 10 that includes a printed circuit board (PCB) 11 having a pocket 12 constructed to reduce the length that signals travel on vias through the PCB. PCB 11 may be constructed of a substrate, such as plastic resin or other appropriate non-conductive material, and includes conductive traces, or vias, over which signals pass between one side 13 of PCB 11 and the other side 14 of PCB 11. The vias may be formed by drilling holes in the PCB and back-filling the holes with copper or other appropriate conductor. Layers of copper or other conductor may be incorporated into the PCB 11 to form length-wise electrical connections across the PCB. For example, FIG. 2, which is a close-up view that includes area 15 of FIG. 1, shows vias 17 and 18, and length-wise electrical connections included in PCB 11. In this example, vias 17 and 18 are interconnected through electrical connections 20. In this example, vias 21 and 22 are interconnected through electrical connections 23. Although not shown here, in some implementations, vias may pass through the entire thickness of the PCB, thereby eliminating the need for length-wise electrical connections.

Referring back to FIG. 1, pocket 12 may be a cut-out, which is formed after construction of PCB 11 or pocket 12 may be formed during the construction of PCB 11. Pocket 12 may have any appropriate depth 24. In some implementations, about 80% of the total thickness 25 of PCB 11 is missing at the pocket, leaving about 20% of the total thickness of the PCB, where the total thickness 25 refers to the depth of the pocket 24 plus the thickness 26 of the circuit board remaining at the site of the pocket. However, in some implementations, different amounts of PCB may be missing at the pocket including, but not limited to, the following. For example, in some implementations, about 95% of the total thickness of the PCB is missing at the pocket, about 90% of the total thickness of the PCB is missing at the pocket, about 85% of the total thickness of the PCB is missing at the pocket, about 75% of the total thickness of the PCB is missing at the pocket, about 70% of the total thickness of the PCB is missing at the pocket, about 65% of the total thickness of the PCB is missing at the pocket, about 60% of the total thickness of the PCB is missing at the pocket, about 55% of the total thickness of the PCB is missing at the pocket, about 50% of the total thickness of the PCB is missing at the pocket, about 45% of the total thickness of the PCB is missing at the pocket, about 40% of the total thickness of the PCB is missing at the pocket, about 35% of the total thickness of the PCB is missing at the pocket, about 30% of the total thickness of the PCB is missing at the pocket, about 25% of the total thickness of the PCB is missing at the pocket, and so forth. In a specific example, a PCB is 0.25 inches in thickness, and 80% of its total thickness is missing at the pocket. The missing percentage of the circuit board, however, is not limited to any particular value, including those listed herein.

Because part of the PCB is missing at the pocket, the PCB is thinner, and the lengths of the vias are shorter in the pocket than in other parts of the PCB. In some implementations, the reduction in via length is proportional to the reduction in thickness of the PCB substrate. For example, if there is an 80% reduction in substrate thickness, there is a corresponding 80% reduction in via length; if there is a 95% reduction in substrate thickness, there is a corresponding 95% reduction in via length; if there is a 90% reduction in substrate thickness, there is a corresponding 90% reduction in via length; if there is an 85% reduction in substrate thickness, there is a corresponding 85% reduction in via length; if there is a 75% reduction in substrate thickness, there is a corresponding 75% reduction in via length; if there is a 70% reduction in substrate thickness, there is a corresponding 70% reduction in via length; if there is a 65% reduction in substrate thickness, there is a corresponding 65% reduction in via length; if there is a 60% reduction in substrate thickness, there is a corresponding 60% reduction in via length; if there is a 55% reduction in substrate thickness, there is a corresponding 55% reduction in via length; if there is a 50% reduction in substrate thickness, there is a corresponding 50% reduction in via length; if there is a 45% reduction in substrate thickness, there is a corresponding 45% reduction in via length; if there is a 40% reduction in substrate thickness, there is a corresponding 40% reduction in via length; if there is a 35% reduction in substrate thickness, there is a corresponding 35% reduction in via length; if there is a 30% reduction in substrate thickness, there is a corresponding 30% reduction in via length; if there is a 25% reduction in substrate thickness, there is a corresponding 25% reduction in via length; and so forth. In some implementations, the proportional reduction is not direct (e.g., 1:1), but rather a reduction in substrate length may lead to a fraction of a reduction in via length or some other appropriate reduction in via length.

In some implementations, the pocket is located in parts of the PCB that pass higher speed signals (e.g., signals that have at least a predefined minimum speed), and not in parts of the PCB that pass lower speed signals. In this context, the terms high or higher and low or lower are relative do not have any particular numerical connotations. In general, a higher speed signal has a rise time that is shorter than the rise time of a lower speed signal. For digital signals, in some implementations, the higher speed signals have speeds that meet or exceed 8 gigabits-per-second (Gb/s), and the lower speed signals have speeds that are less than 8 Gb/s; in some implementations, the higher speed signals have speeds that meet or exceed 10 Gb/s, and the lower speed signals have speeds that are less than 10 Gb/s; in some implementations, the higher speed signals have speeds that meet or exceed 16 Gb/s, and the lower speed signals have speeds that are less than 16 Gb/s; in some implementations, the higher speed signals have speeds that meet or exceed 32 Gb/s, and the lower speed signals have speeds that are less than 32 Gb/s; in some implementations, the higher speed signals have speeds that meet or exceed 64 Gb/s, and the lower speed signals have speeds that are less than 64 Gb/s; in some implementations, the higher speed signals have speeds that meet or exceed 128 Gb/s, and the lower speed signals have speeds that are less than 126 Gb/s; in some implementations, the higher speed signals have speeds that meet or exceed 256 Gb/s, and the lower speed signals have speeds that are less than 256 Gb/s; and so forth. For analog signals, in some implementations, the higher speed signals have speeds that meet or exceed 8 gigaHertz (GHz), and the lower speed signals have speeds that are less than 8 GHz; in some implementations, the higher speed signals have speeds that meet or exceed 10 GHz, and the lower speed signals have speeds that are less than 10 GHz; in some implementations, the higher speed signals have speeds that meet or exceed 16 GHz, and the lower speed signals have speeds that are less than 16 GHz; in some implementations, the higher speed signals have speeds that meet or exceed 32 GHz, and the lower speed signals have speeds that are less than 32 GHz; in some implementations, the higher speed signals have speeds that meet or exceed 64 GHz, and the lower speed signals have speeds that are less than 64 GHz; in some implementations, the higher speed signals have speeds that meet or exceed 128 GHz, and the lower speed signals have speeds that are less than 126 GHz; in some implementations, the higher speed signals have speeds that meet or exceed 256 GHz, and the lower speed signals have speeds that are less than 256 GHz; and so forth. In some implementations, the higher speed signals and/or the lower speed signals may have signal speeds different than those listed above.

Figure 2:
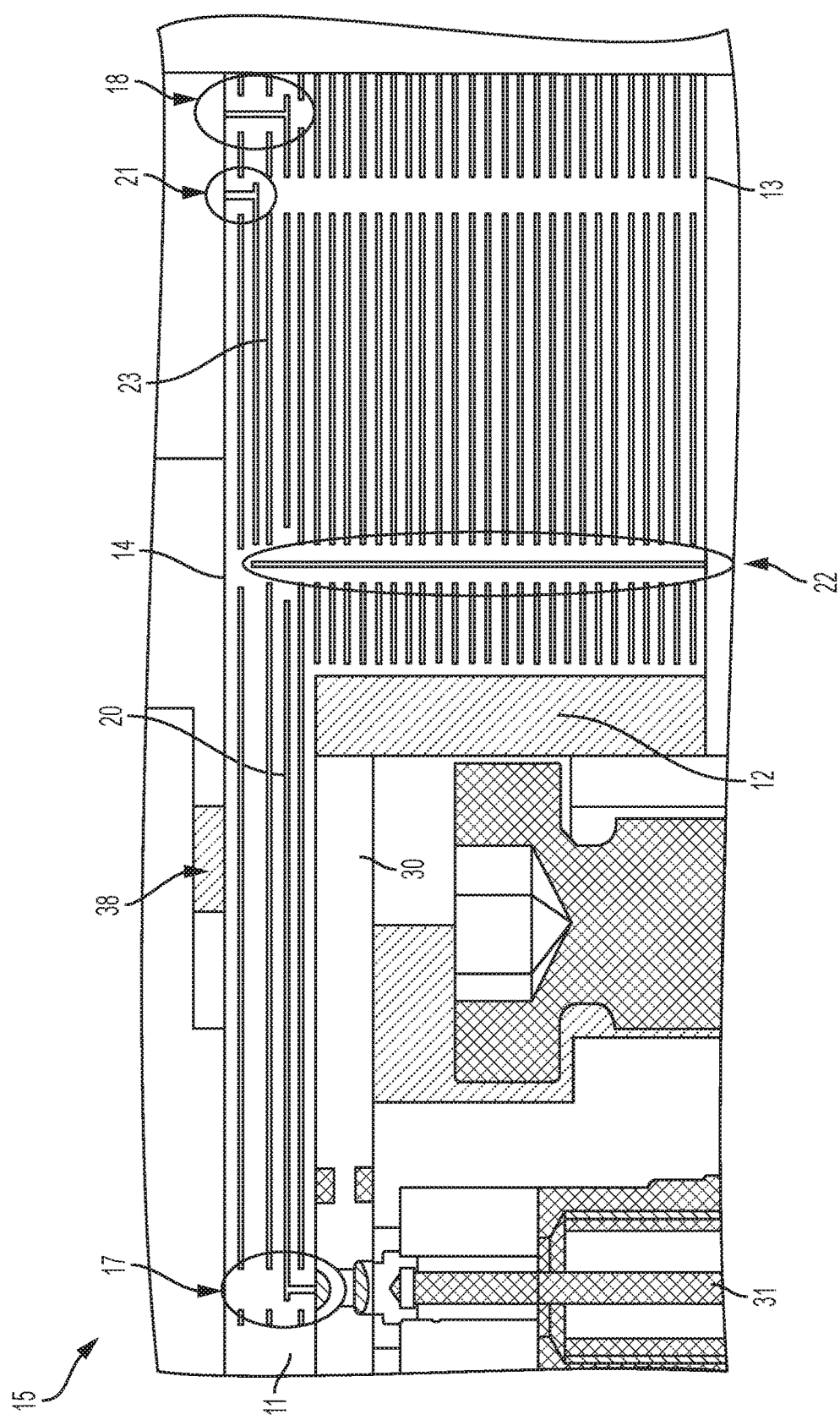
FIG. 2 is a close-up view of a portion of the circuit board structure.

Thicker parts 27 of the PCB, e.g., those parts that are outside of the pocket, pass lower speed signals. Power lines and planes (not shown) may also be routed through these thicker parts of the PCB. The power lines provide power to a device or board connected to circuit board structure 10. Lower speed signals and power signals may be less susceptible to signal degradation than higher speed signals. As such, there is less of a need to reduce the thickness of the PCB to accommodate these signals, and they may pass over conductors having longer lengths than vias for the higher speed signals. For example, FIG. 2 shows the total via length in a single signal path (from the pocket) that passes higher speed signals, and the total via length in a single signal path (from outside the pocket) that passes lower speed signals. In this example, each total via length includes contributions from two separate vias (e.g., 17 and 18 for a higher speed signal, and 21 and 22 for a lower speed signal). The total via length for the higher speed signal, which includes a via connected through pocket 12, is less than the total via length for a lower speed signal, which does not include a via connected through pocket 12.

Preserving a thicker part of the substrate for, e.g., lower speed and power signals, may be advantageous from a structural standpoint, since the thinner parts 28 of the PCB can be more susceptible to damage. To counteract increased fragility resulting from the missing substrate, a backing plate 29 may be placed adjacent to, and in contact with, surface 14 of PCB 11 on the other side of pocket 12 to reinforce the PCB structurally. Appropriate measures must be taken to reduce the chances that the backing plate will interfere electrically with the functionality of the PCB. These measures may include providing a layer of insulation on backing plate 29 and "back drilling" (partial removal) of the vias that interact with that portion of the PCB that the backing plate might contact, or it may require that the backing plate be made of electrically non-conductive material. That is, since the substrate, and thus the PCB, is thinner at the location of pocket 12, the PCB is more fragile in that region than in its thicker regions. As a result, pressure applied when making electrical connections to the PCB pads, which are in turn connected to vias (e.g., vias 17, 18, 21 and 22 in FIG. 2) may make the PCB more susceptible to bending or breakage at the location of the pocket. The backing plate provides additional support, which reduces the chances that the PCB will be damaged or even break. In some implementations, backing plate 29 may be made of stainless steel or of any other appropriate conductive or non-conductive material that has sufficient strength to withstand the force needed to make an electrical connection. In some implementations, that force is about 40 pounds (lbs) to 50 lbs; however, in other implementations, that force may be 10 lbs, 15 lbs, 20 lbs, 25 lbs, 30 lbs, 35 lbs, 55 lbs, 60 lbs, 65 lbs, 70 lbs, and so forth. These values are examples only, and a backing plate to withstand any appropriate force may be incorporated into the circuit board structure described herein.

Circuit board structure 10 may also include an interposer 30. Interposer 30 includes electrical and mechanical structures to interface between vias in PCB 11 and external electrical conduits 31. In this example, external electrical conduits 31 (in this example, coaxial cable) carry electrical signals from a source, such as one or more instrument boards and/or a test computer, to pass those signals through PCB 11 to a device under test (DUT) connected to the PCB. Therefore, in this example, interposer 30 is constructed to accommodate a coaxial cable connection, e.g., to establish a connection between the electrical conduit in the coaxial cable and the vias in the PCB. In some implementations, the external electrical conduits may be a type of conduit other than coaxial cable, in which case the interposer may be configured differently. Generally, the interposer may be configured to accommodate any appropriate type of electrical conduit. In the example of FIG. 1, the interposer may include springs or be made of a material that is relatively flexible or springy to facilitate electrical connection between each via in the PCB and a corresponding coaxial cable electrical conduit.

Figure 3:
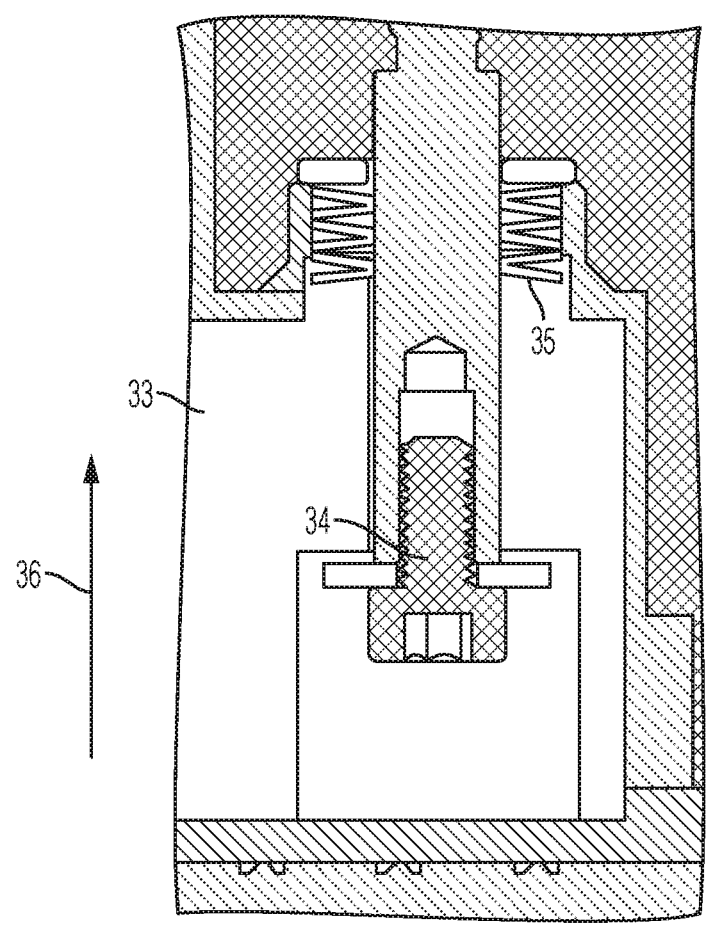
FIG. 3 is a section view of a spring loaded structure to which Midstrip assemblies are mounted.

In the example of FIG. 1, a Midstrip assembly 32 provides a physical interface to the external electrical conduits. In this example, Midstrip assembly 32 includes a structure 33, through which pins of the coaxial cable pass to connect to the interposer. Structure may be made of Teflon® or any other appropriate material. Midstrip assembly 32 or structure 33 that it is mounted onto it is spring loaded, as shown in FIG. 3, to facilitate connection of the coaxial cable electrical conduit to interposer. In more detail, FIG. 3 shows a screw 34 that secures structure 33 using springs 35, to the tester interface frame assembly. Structure 33 moves in response to force applied by the interface board that is clamped on top on interposers direction of arrow 36, causes springs 35 to compress, thereby enabling contact between the coaxial cable electrical conduit and a corresponding electrical contact on the interposer (which connects to a corresponding via).

As shown in FIG. 1, Midstrip assembly 32 includes element 37, which is an electrically conductive "ferrule" that creates an electrical path between the outer shield of the coaxial cable and the Midstrip body. Insulators include structure 33, which is a PTFE (Teflon®) insulator, and element 33a. Element 33b is also an insulator, and surrounds the center conductor of the coaxial cable centering the center conductor relative to an outer shield.

Midstrip assembly 32 fits, at least partly, into pocket 12, and also includes alignment pins 38 to align the Midstrip and interposer to the circuit board structure, as described herein.

Figure 4:
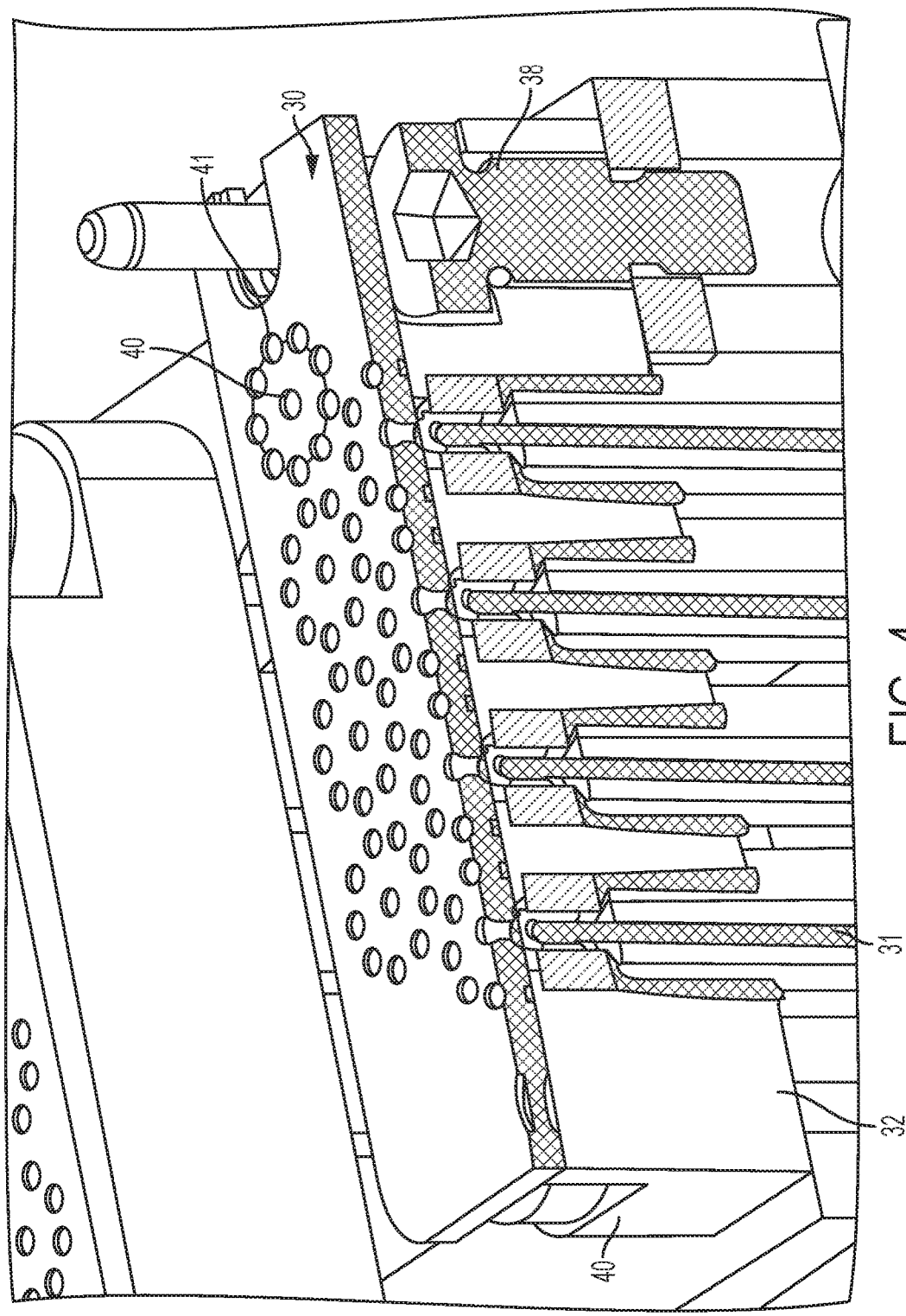
FIG. 4 is a perspective cut-away view of a Midstrip assembly having an interposer installed thereon

In some implementations, the Midstrip assembly is configured as one or more towers that mate to complementary cavities or pockets in another PCB. FIG. 4 shows an example implementation of this type. In this example, tower 40 is cut-away to reveal conduit (co-axial cable) 31, Midstrip assembly 32, interposer 30, and alignment pins 38. In some implementations, the backing plate is not included (e.g., the backing plate is optional), as is the case in the implementation of FIG. 4. The contacts at the top of interposer 30 include a center conductor 40, which is a signal contact for the external conduit, and a ground/return contact ring 41 for connection to a ground or return line.

Figure 5:
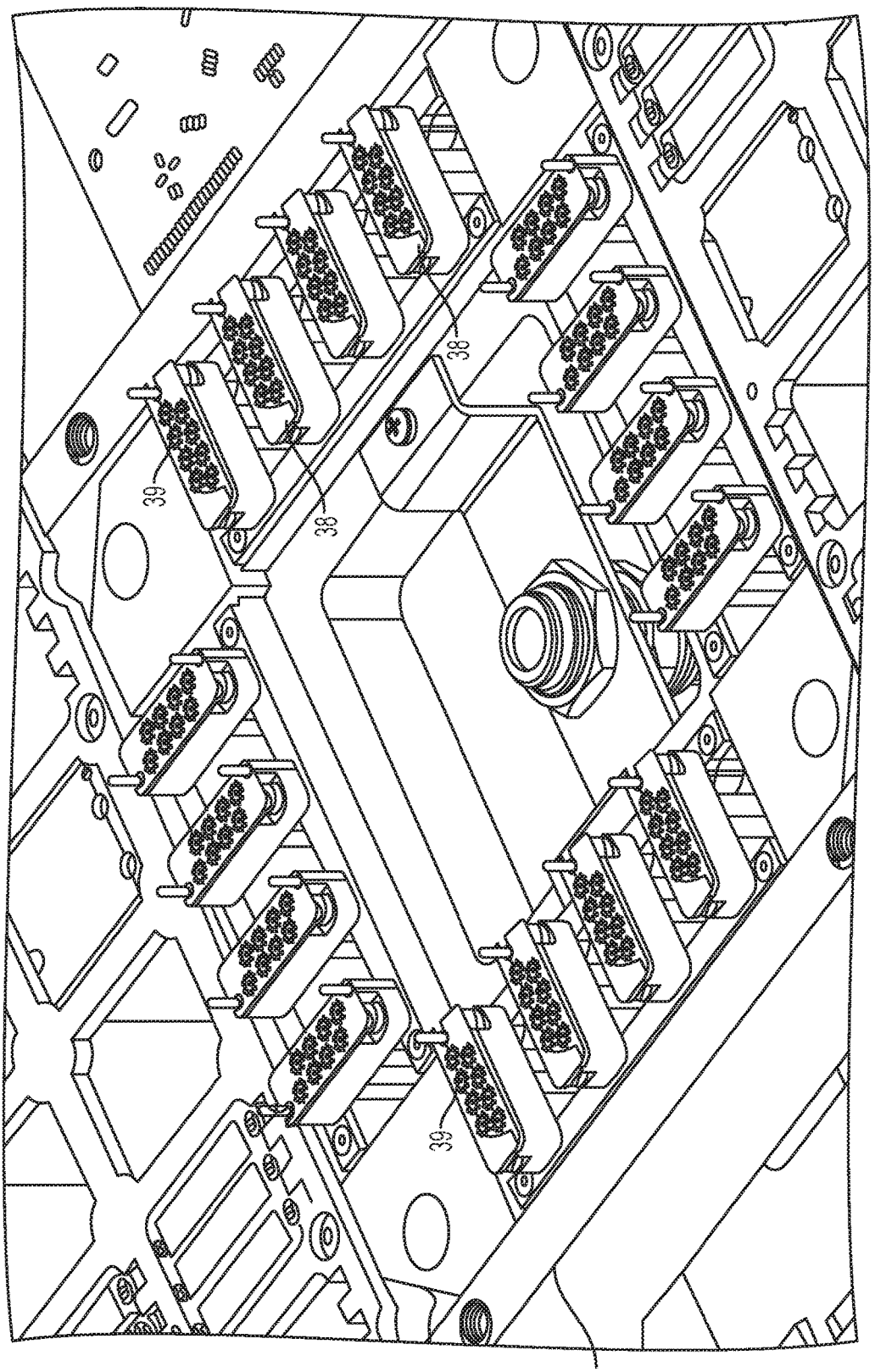
FIG. 5 is a perspective view of an electro-mechanical interface onto which the device interface board is installed.
Figure 6:
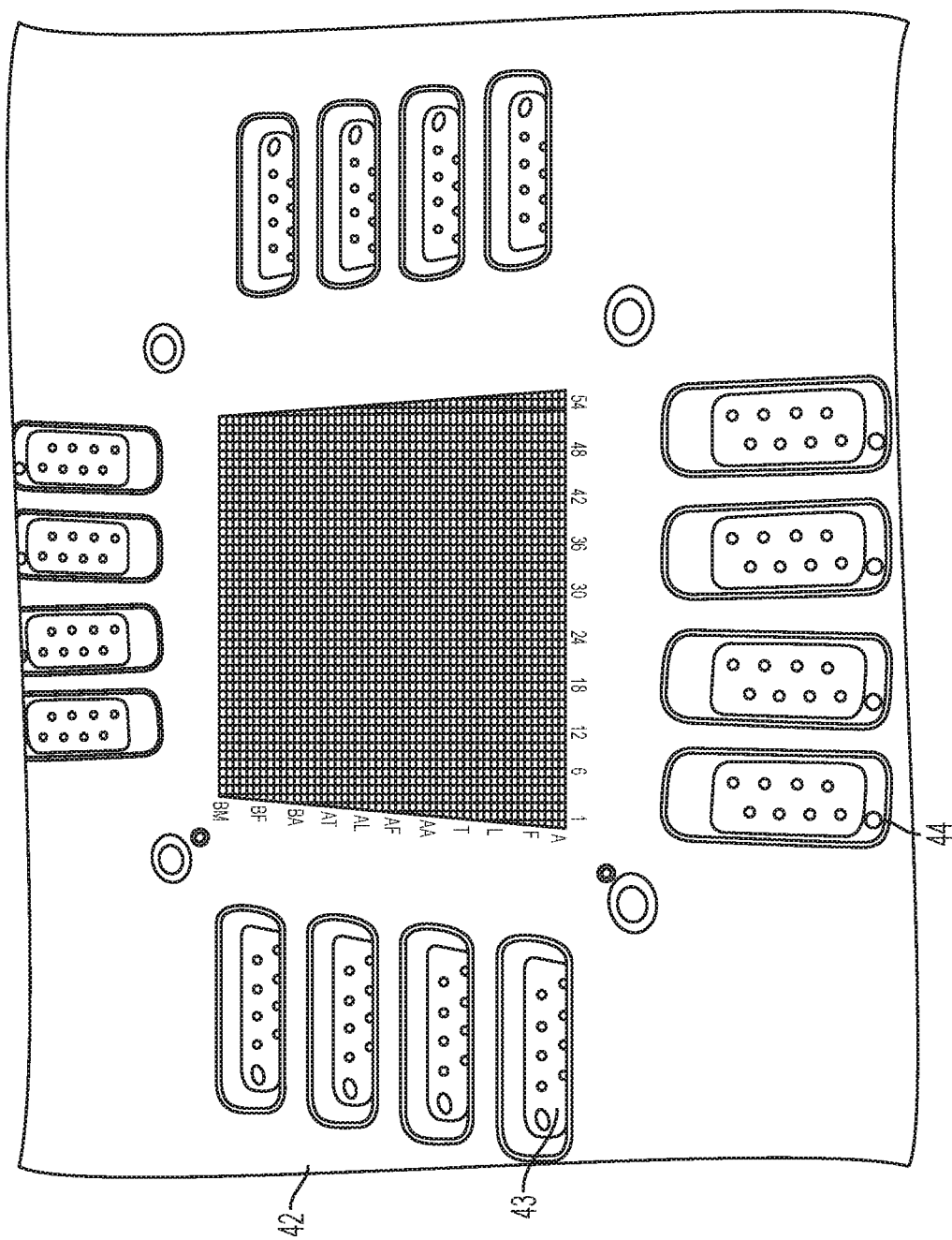
FIG. 6 is a perspective top view of a device interface board.

FIG. 5 shows an example device, in this example a pitch plate assembly 45 for a test head, which includes towered circuit board structures 39 of the type described herein (all of which may have the same structure, but only two of which are labeled). Alignments pins 38 are also shown, although only two are labeled. Each tower is configured to mate to a complementary pocket in another circuit board, with alignment pins 38 enabling alignment between the tower and the circuit board, and thus facilitating the connection. FIG. 6 a printed circuit board that includes cavities or pockets that are complementary to the towers 39 of FIG. 5. Towers 39 thus fit within pockets 43 in printed circuit board 42, with the alignment pins fitting into corresponding holes 44. Electrical connections are made between contacts on the towers and corresponding contacts on the device.

Figure 7A:
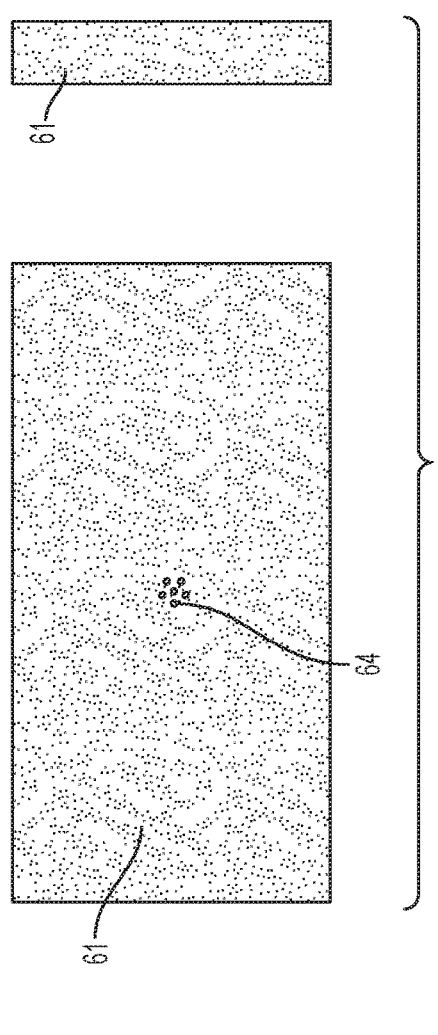
FIGS. 7A and 7B include front and side views of parts of circuit boards.
Figure 7B:
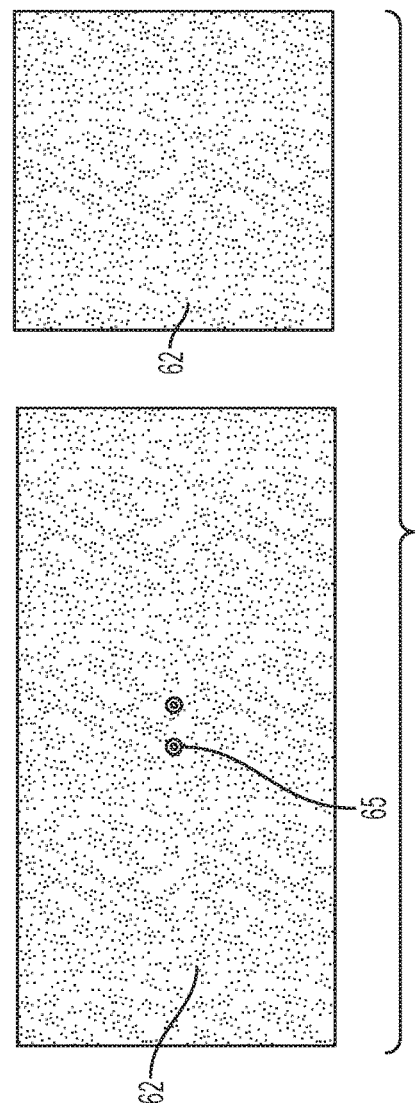

In the example of FIGS. 7A and 7B circuit board 61 is ⅕th the thickness of circuit board 62. A DIB is 0.25" thick. Given the limitations of PCB fabrication, the aspect ratio (e.g., the drill diameter as related to the thickness of the board being drilled) of board drills is roughly 10:1. In other words, the smallest hole that can be reliably drilled through a 0.25" thick board is roughly 0.025" in diameter. Since, in some examples, the pocketed PCB described herein allows the drilled board thickness to be ⅕th that which is possible using conventional technology, it follows that the drill diameters that can be used to drill the vias also are reduced by the same ratio or by some other appropriate amount.

If the drills used are smaller, not only can the drill size be reduced, but also the number of return paths, colloquially called "grounds", can be increased significantly (as shown in FIG. 7A, which shows six grounds 64 versus the two grounds 65 shown in FIG. 7B). A single pair of a signal and a return via (shown in FIG. 7B) can be a relatively poor quality transmission line, whereas the group shown in FIG. 7A having a single signal surrounded by six returns will typically result in not only improved shielding from crosstalk but also improved impedance control. In turn, the improved impedance control will typically result in improved signal fidelity (reduced insertion loss) and reduced return loss, which may be significantly above and beyond the simple improvement that results from the reduced via lengths.

It is typically not possible, due to board space limitations, to replicate the via pattern shown in FIG. 7A on the board of FIG. 7B due to space limitations.

Although the example of FIGS. 5 and 6 uses circuit board structure 10 in a testing context, the circuit board structure described herein is not limited to testing or to the examples provided in the figures, and may be used in any appropriate context.

The DIB, represented in part by FIG. 5, may be incorporated into a test system. In this regard, to test quantities of components, manufacturers commonly use automatic test equipment (ATE) (also referred to as "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and a test instrument or a single device having corresponding functionalities.

Figure 8:
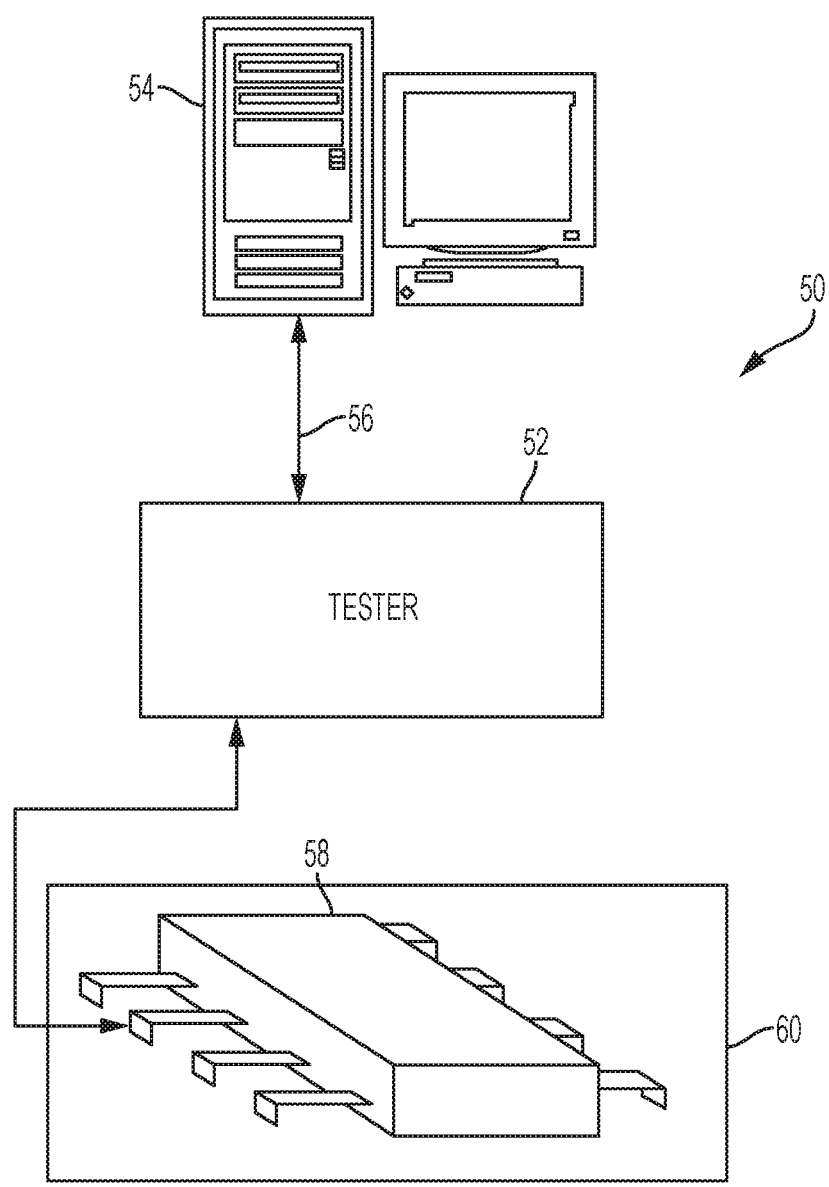
FIG. 8 is a block diagram of automatic test equipment.

Referring to FIG. 8, an example ATE 50 for testing a DUT 58 includes a tester (or "test instrument") 52. DUT 58 may be interfaced to a DIB 60, which may have a pocketed PCB structure of the type described herein Tester 52 may include a number of channels. To control tester 52, system includes a computer system 54 that interfaces with tester 52 over one or more electrical connections 56. In an example operation, computer system 54 sends commands to tester 52 to initiate execution of routines and functions for testing DUT 58. Such executing test routines may initiate the generation and transmission of test signals to the DUT 58 and collect responses from the DUT. Various types of DUTs may be tested by system 50. In some implementations, the DUTs may be RF, microwave, or other wireless devices. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, 52 is connected to an interface to the internal circuitry of DUT 58. For example, the DUT may be inserted into a socket in DIB 60, which may be implemented using a pocketed PCB of the type described herein, and which contains interfaces to electrical connections between the DUT and an instrument module in the tester.

Another example implementation of a pocketed PCB is described below. In this regard, when combining microwave circuitry, logic, and control circuitry on a single PCB, dimensional and signal integrity requirements can create fabrication problems. Use of a pocketed PCB may enable manufacture of a PCB that combines microwave components and fine pitch digital integrated circuits (ICs). The use of a pocketed PCB may also improve microwave signal performance in which very fine pitch (e.g., 0.4 mm pitch or less) components are used.

Figure 9:
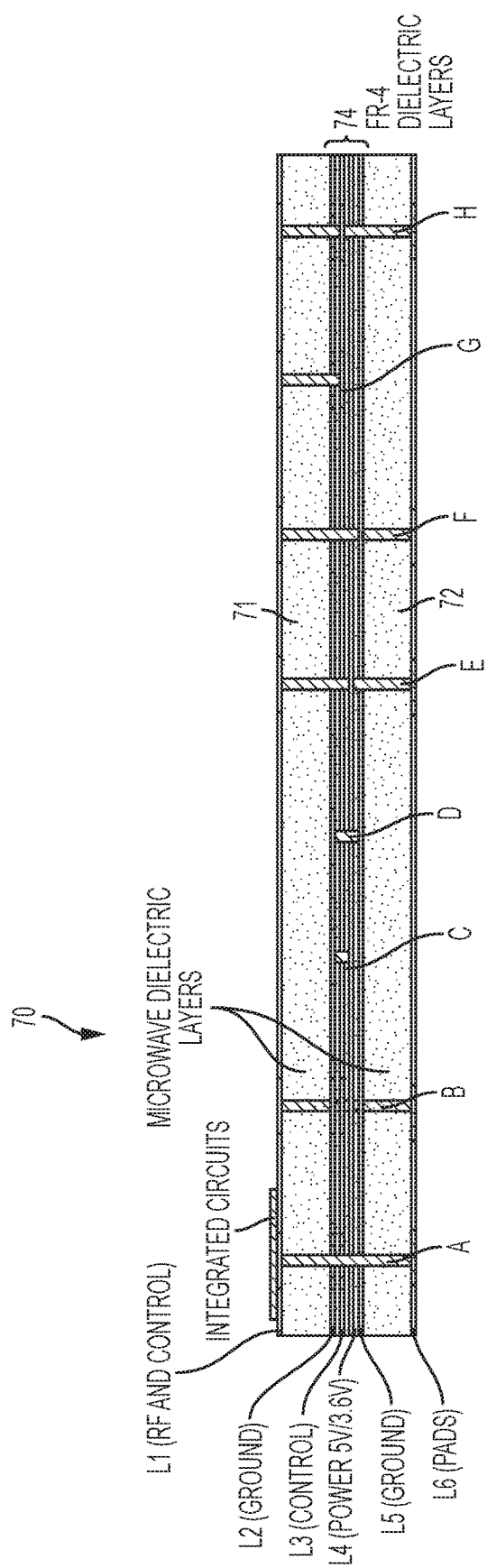
FIG. 9 is a side view of a circuit board structure having no pockets.

FIG. 9 shows a conventional PCB 70 for use with microwave components that transmit radio frequency (RF) signals (an example of a first type signal) and fine pitch digital ICs that transmit digital or other non-RF signals (examples of second type signals). In the example of FIG. 9, PCB 70 includes two thicker layers 71, 72 of microwave dielectric and four thinner layers 74 of FR-4 dielectric. Dielectrics are generally classified into non-RF (e.g., FR-4, G-10, etc.) dielectrics and RF or microwave dielectrics (e.g., PTFE, Rogers 4360, etc.), where the microwave dielectrics typically have better electrical performance and are more expensive. FR-4 dielectric is a composite typically made of woven fiberglass cloth with an epoxy resin binder. Microwave dielectric is a dielectric in which permittivity and loss are controlled more tightly than FR-4, and is used to maintain the signal integrity of microwave signals. The FR-4 layers include circuit traces for routing signals, and metal pads on which circuit components may be mounted.

In FIG. 9, all components may be surface-mounted to layers L1 or L6 (the top and bottom layers, respectively, of the circuit board structure). In operation, in order to connect control lines and power to microwave circuitry mounted on layer L1, it is often necessary to route signals from layer L1 into internal layers L3 or L4 and then back "up" to layer L1. This may be necessary to obtain more space (due to numbers of signals), to leave space around controlled impedance traces, to control signal isolation, to facilitate signal crossover, or for any other appropriate reason.

Vias are drilled and plated as part of the PCB fabrication process. The vias may be drilled through the PCB, through one or more layers, or to a specific depth. Vias that pass completely through the layer stack (e.g., vias A, B, E, F, H) are generally preferred for cost and manufacturability. Buried vias (e.g., vias C, D) and blind vias (e.g., via G) may be used but are typically more complex and costly than vias that pass completely through the layer stack. In general, routing of RF signals on a layer will be given priority over routing of control, power, and other signals on that same layer, since control, power, and other signals are less sensitive to trace dimensions (width, thickness, length) and spacing than RF signals. RF layer conductor dimensions, dielectric properties, and the like are selected to achieve appropriate loss, isolation, matching, and characteristic impedance properties.

Figure 10:
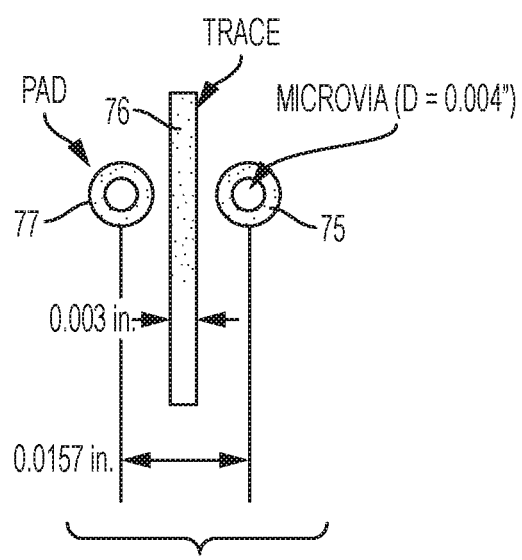
FIG. 10 is a top view of example via holes and a trace on a circuit board structure.

In the example shown in FIG. 9, the vias connecting layers L1 to L3 and L4 (vias G and H) are high aspect ratio, meaning they have a large length or depth relative to hole diameter. If non-microwave (e.g., control) components on layer L1 have a very fine pitch (e.g., a 0.4 mm pitch ball grid array (BGA) or less), then there are multiple adjacent pads on L1 that must not touch. Additionally, further spacing separation is required to route traces between the adjacent pads from inner pads of the ball grid array. FIG. 10 shows an example in which a fine pitch BGA (micro-via) 75 is adjacent to a trace 76 and a pad 77. FIG. 10 also shows example dimensions for these components; however, the components and associated PCB are not limited to use with these dimensions, nor are very fine pitch BGAs limited to 0.4 mm or less.

Figure 11:
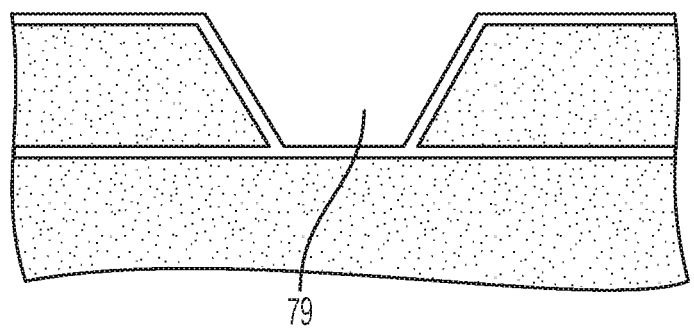
FIG. 11 is a side view of an example laser-drilled via.

As a result of the foregoing, pad sizes become very small, necessitating a fine drill diameter to avoid weakening the pads and the pad attachment to the substrate. As a result, mechanical drilling becomes impractical and a laser drill is used instead to create vias. However, laser drilled holes (micro-vias) become wider as they deepen. An example of a widened hole 79 produced through laser drilling is shown in FIG. 11. As a result, the laser drill cannot drill to the depth (e.g., 0.030 inches) of a microwave dielectric and simultaneously maintain the required fine pitch for layer L1 components—because the deep via will widen the hole on the layer L1 side, which reduces the annular ring width of the pads and degrades the pad metallization's attachment to the dielectric substrate.

In addition, via A, which carries microwave signals from layers L1 to L6, is electrically long and passes through non-microwave dielectric layers (labeled FR-4 in FIG. 1). Both of these introduce performance degradation (loss, mismatch) and additional design work (e.g., design for characteristic impedance).

Figure 12:
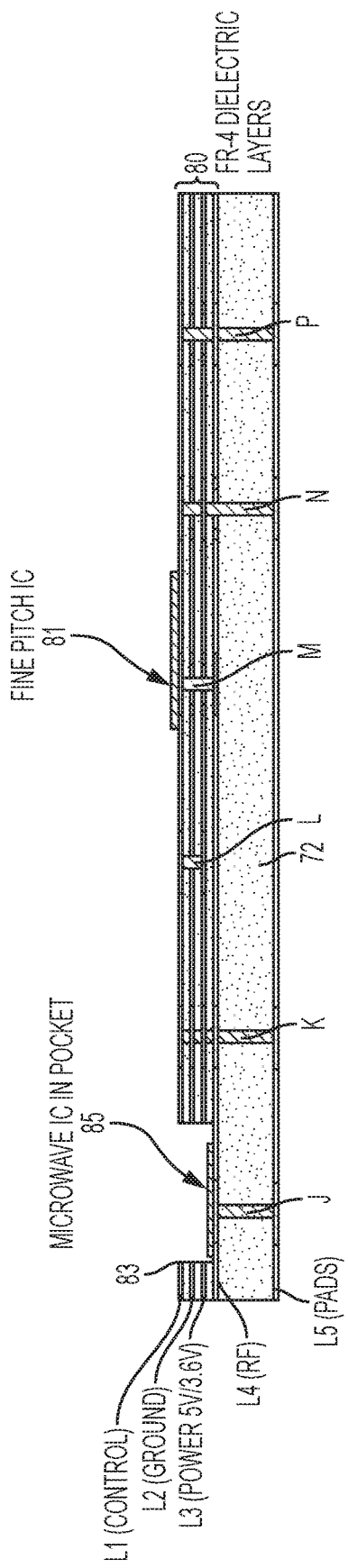
FIGS. 12 and 13 are side views of example circuit board structures having pockets.

Use of a pocketed PCB may address the foregoing drawbacks associated with the PCB structure of FIG. 9. FIG. 12 illustrates an example implementation of a PCB having a pocket, and FIG. 13 illustrates a second implementation of a PCB having a shelf (which is a type of pocket).

In both the implementations of FIGS. 12 and 13, the top microwave dielectric layer 71 of FIG. 9 is removed, making it possible to mount fine pitch ICs 81 directly onto an FR-4 dielectric layer stack 80 (without requiring routing through a microwave dielectric); however, as noted below, this is not a requirement. In FIG. 12, IC 81 is mounted onto FR-4 dielectric layer stack 80. Pocket 83 is created in the PCB by removing several (in this example, three) FR-4 dielectric layers, leaving FR-4 dielectric layer L4 (adjacent to remaining microwave dielectric 72) exposed. A microwave IC 85 can be mounted on metal contained on the L4 layer so that RF signals pass through the microwave dielectric 72, without passing through unnecessary FR-4 layers. Signals passing to and from the fine pitch IC 81 mounted on layer L1 generally need not pass through the microwave dielectric, so removal of the upper microwave dielectric layer will not affect those signals.

Figure 13:
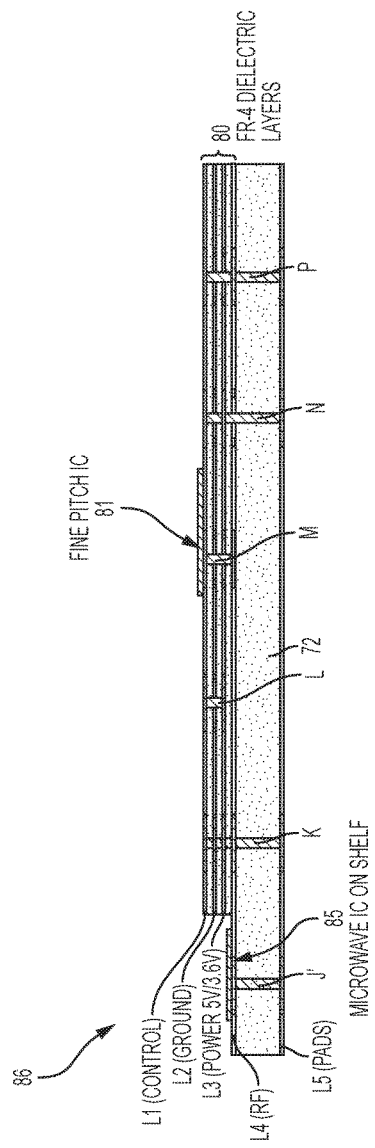

Likewise, in FIG. 13, IC 81 is mounted onto FR-4 dielectric layer stack 80. Pocket (or shelf) 86 is created in the PCB by removing several (in this example, three) FR-4 dielectric layers, leaving the L4 dielectric layer (adjacent to remaining microwave dielectric 72) exposed. A microwave IC 85 can be mounted on the L4 layer so that RF signals pass through the microwave dielectric 72.

Comparing the microwave signal path through via A (FIG. 9) to the microwave signal paths through vias J and J' (FIGS. 12 and 13), it can be seen that the electrical length has been reduced. Furthermore, discontinuities introduced by passing through additional FR-4 layers may be reduced. Additionally, compare control signals routed, from the fine pitch IC to the microwave IC. In the implementation of FIG. 9, such signals traverse from layer L1 using via H or G where they are routed back up to layer L1 using another via H or G. As discussed earlier these vias are not realizable in the area of a fine pitch IC. In the example implementations shown FIGS. 12 and 13, the signals travel from layer L1 to layer L4 using via M which, in this example, is under ½ the length of the via path used in the configuration of FIG. 9, is readily realizable, and is compatible with fine pitch components.

As noted, the top microwave dielectric layer has been removed in the implementations of FIGS. 12 and 13. This is not a requirement, but illustrates that the construction has freed the outer layer for use with high density signal and control traces and test points without interfering with layer L4 RF signal routing.

To create these structures of FIGS. 12 and 13, pockets in the PCB layers may be created by either through- or controlled depth routing the board during manufacturing of the PCB. This can be done with mechanical milling, lasers, a combination thereof, or any other appropriate techniques.

Other implementations may include, but are not limited to, more or less layers, more or less pockets, symmetric and asymmetric layups, and/or pockets on both sides of the PCB. The microwave area could be small or large in comparison with the overall area. Components may be mounted on top, or bottom, or both sides of the board or in multiple terraces. The non-microwave dielectric could be a flexible material such as Kapton®. The pocket may be plated or un-plated. The pocket may be covered or open. The pocketed PCB may be used with any appropriate via diameter.

While this specification describes example implementations related to "testing" and a "test system," the devices and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices: The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

Any "electrical connection" as used herein may imply a direct physical connection or a connection that includes intervening components but that nevertheless allows electrical signals (including wireless signals) to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

Any "electrical connection" as used herein may imply a direct physical connection or a connection that includes intervening components but that nevertheless allows electrical signals to flow between connected components. Any "connection" involving electrical circuitry mentioned herein, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A circuit board structure comprising:
   a substrate; and
   vias that are electrically conductive and that pass through the substrate to enable electrical connection through the circuit board structure;
   wherein the substrate is thinner in first areas of the circuit board structure that deliver first type signals than in second areas of the circuit board structure that deliver second type signals.

2. The circuit board structure of claim 1, wherein lengths of the vias are shorter in the first areas of the substrate; and
   wherein the first type signals comprise first speed signals, the second type signals comprise second speed signals and power, and the first speed signals have a shorter rise time than the second speed signals.

3. The circuit board structure of claim 1, wherein the substrate comprises one or more pockets that are at thinner parts of the substrate in the first areas.

4. The circuit board structure of claim 3, wherein the substrate comprises multiple layers, the one or more pockets being formed by removal of at least some of the multiple layers.

5. The circuit board structure of claim 1, further comprising:
   a backing plate disposed adjacent to thinner parts of the substrate in the first areas to reinforce the substrate.

6. The circuit board structure of claim 2, further comprising:
   an interposer adjacent to the substrate and comprising electrical paths that connect to the vias to establish a signal path, the interposer comprising contacts for mating to an external device, the interposer comprising a structure that provides a micro-compliant electrical path from the circuit board structure to an assembly that carries the first speed signals to/from a source/receiver.

7. The circuit board structure of claim 1, further comprising:
   one or more alignment pins through the substrate for aligning to one or more connectors to the circuit board structure.

8. The circuit board structure of claim 2, wherein the first speed signals have speeds that meet or exceed 16 gigabits-per-second, and the second speed signals have speeds that are less than 16 gigabits-per-second; or
   wherein the first speed signals have speeds that meet or exceed 16 gigahertz, and the second speed signals have speeds that are less than 16 gigahertz.

9. The circuit board structure of claim 2, wherein the first speed signals have speeds that meet or exceed 32 gigabits-per-second, and the second speed signals have speeds that are less than 32 gigabits-per-second; or
   wherein the first speed signals have speeds that meet or exceed 32 gigahertz, and the second speed signals have speeds that are less than 32 gigahertz.

10. The circuit board structure of claim 2, wherein the first speed signals have speeds that meet or exceed 64 gigabits-per-second, and the second speed signals have speeds that are less than 64 gigabits-per-second; or
    wherein the first speed signals have speeds that meet or exceed 64 gigahertz, and the second speed signals have speeds that are less than 64 gigahertz.

11. The circuit board structure of claim 1, wherein thinner parts of the substrate in the first areas have a thickness that is 20% or less of thicker parts of the substrate in the second areas.

12. The circuit board structure of claim 1, wherein thinner parts of the substrate in the first areas have a thickness that is 30% or less of thicker parts of the substrate in the second areas.

13. The circuit board structure of claim 1, wherein thinner parts of the substrate in the first areas have a thickness that is 40% or less of thicker parts of the substrate in the second areas.

14. The circuit board structure of claim 1, further comprising a tower that mates to a complementary pocket in another circuit board.

15. A device interface board for connection between a device under test and test equipment, the device interface board comprising the circuit board structure of claim 1.

16. The circuit board structure of claim 1, wherein the first type signals comprise radio frequency (RF) signals and the second type signals comprise non-RF signals.

17. The circuit board structure of claim 1, wherein the first areas of the substrate comprise an area that includes a first dielectric having metal on which a microwave component is mountable, the first dielectric being adjacent to a microwave dielectric layer.

18. The circuit board structure of claim 1, wherein the second areas of the substrate comprise an area that includes a stack of dielectric layers that that do not include a microwave dielectric.

19. The circuit board structure of claim 1, wherein the vias have a diameter that is based on a thickness of the first areas of the substrate.

20. The circuit board structure of claim 1, wherein the vias in the first areas of the substrate have diameters that are less than diameters of vias in the second areas of the substrate.

21. A device interface board (DIB) comprising:
a substrate having a first area of a first thickness and a second area of a second thickness, the second thickness being greater than the first thickness; and
vias that are electrically conductive and that pass through the first area to enable electrical connection between the vias and a device under test, where vias that pass through the first area are reserved for transmission of signals having at least a minimum speed.

22. The DIB of claim 21, wherein the DIB comprises vias through the second area that are reserved for transmission of signals that do not meet the minimum speed.

23. The DIB of claim 21, further comprising:
a backing plate disposed adjacent to the first areas to reinforce the substrate.

24. The DIB of claim 21, further comprising:
one or more alignment pins through the substrate for aligning to one or more connectors that are connectable to the DIB.

25. The DIB of claim 21, wherein the minimum speed is 16 gigabits-per-second, 32 gigabits-per-second, or 64 gigabits-per-second; or
wherein the minimum speed is 16 gigahertz, 32 gigahertz, or 64 gigahertz.

26. The DIB of claim 21, wherein the first areas of the substrate have a thickness that is 20% or less of the second areas of the substrate.

* * * * *